(12) United States Patent
Jen et al.

(10) Patent No.: US 10,083,906 B1
(45) Date of Patent: Sep. 25, 2018

(54) MEMORY DEVICE WITH BURIED WORD LINE FOR REDUCED GATE-INDUCED DRAIN LEAKAGE CURRENT AND METHOD FOR MANUFACTURING THE SAME

(71) Applicant: Winbond Electronics Corp., Taichung (TW)

(72) Inventors: Kai Jen, Taichung (TW); Wei-Che Chang, Taichung (TW); Kazutaka Manabe, Taichung (TW); Kazuaki Takesako, Taichung (TW); Noriaki Ikeda, Taichung (TW); Yoshinori Tanaka, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 15/895,568

(22) Filed: Feb. 13, 2018

(30) Foreign Application Priority Data

Jul. 4, 2017 (CN) .......................... 2017 1 0535737

(51) Int. Cl.
*H01L 27/108* (2006.01)
*H01L 23/522* (2006.01)

(52) U.S. Cl.
CPC ...... *H01L 23/5226* (2013.01); *H01L 23/5222* (2013.01); *H01L 23/5228* (2013.01); *H01L 27/10891* (2013.01)

(58) Field of Classification Search
CPC ............. H01L 23/5222; H01L 23/5226; H01L 23/5228; H01L 27/10891
See application file for complete search history.

(56) References Cited

U.S. PATENT DOCUMENTS

| 8,610,203 B2 * | 12/2013 | Kim ................ H01L 21/823437 |
| | | 257/330 |
| 9,502,526 B2 * | 11/2016 | Jang .................. H01L 29/66621 |
| 2010/0207205 A1 * | 8/2010 | Grebs ................... H01L 23/544 |
| | | 257/334 |
| 2012/0012925 A1 | 1/2012 | Oh |
| 2012/0205774 A1 * | 8/2012 | Wang ................ H01L 21/76232 |
| | | 257/506 |

FOREIGN PATENT DOCUMENTS

TW 201349360 A 12/2013

\* cited by examiner

*Primary Examiner* — Andrew Q Tran
(74) *Attorney, Agent, or Firm* — Muncy, Geissler, Olds & Lowe, P.C.

(57) ABSTRACT

A memory device and a method for manufacturing a memory device are provided. The memory device includes a semiconductor substrate having a trench, an oxide layer formed on a surface of the trench, and a buried word line formed in the trench having the oxide layer formed thereon. The oxide layer includes a first portion extending downward from a top surface of the semiconductor substrate, a second portion extending upward from a bottom portion of the trench, and a third portion formed between and adjoining the first portion and the second portion. The third portion tapers toward the second portion. The first portion of the oxide layer is located between the buried word line and the surface of the trench.

20 Claims, 8 Drawing Sheets

MEMORY DEVICE WITH BURIED WORD LINE FOR REDUCED GATE-INDUCED DRAIN LEAKAGE CURRENT AND METHOD FOR MANUFACTURING THE SAME

CROSS REFERENCE TO RELATED APPLICATIONS

This Application claims priority of China Patent Application No. 201710535737.7, filed on Jul. 4, 2017, the entirety of which is incorporated by reference herein.

BACKGROUND

Field of the Disclosure

The present disclosure relates to a memory device, and in particular it relates to a memory device having buried word lines and a method for manufacturing the memory device.

Description of the Related Art

With the increasing popularity of portable electronic products, consumer demand for memory devices is also increasing. All portable electronic products (such as digital cameras, notebook computers, mobile phones, etc.) need a lightweight and reliable memory device for the storage and transmission of data. Dynamic random access memory (DRAM) has many advantages, such as small volume, large memory capacity, high speed of reading/writing, and long product life. Therefore, it is widely used in a variety of electronic products.

Given the trend of miniaturization of electronic products, there is a demand for miniaturization of memory devices as well. When the degree of integration of the semiconductor element in the memory device becomes higher, the distance between the word line and the bit line becomes shorter. As a result, parasitic capacitance can easily occur between the word line and the bit line, adversely affecting the operational reliability of the memory device. In order to solve this problem, a memory device using a buried word line is proposed. In a memory device using a buried word line, however, the gate (buried word line)-induced drain leakage current may be increased. As a result, an error may occur during the operation of the memory device. In order to reduce the gate-induced drain leakage current, the conductive material used to form the buried word line is etched to a deeper depth in the conventional memory device. This increases the electrical resistance of the buried word line, however, which in turn reduces the operational speed of the memory device.

Therefore, there is still a demand for a memory device with high reliability and high performance, as well as a simpler and less-costly manufacturing method.

BRIEF SUMMARY

The disclosure provides a memory device. The memory device includes a semiconductor substrate having a trench, an oxide layer formed on a surface of the trench, and a buried word line formed in the trench having the oxide layer formed thereon. The oxide layer includes a first portion extending downward from a top surface of the semiconductor substrate, a second portion extending upward from a bottom of the trench, and a third portion formed between and adjoining the first portion and the second portion. The third portion tapers toward the second portion. The first portion of the oxide layer is located between the buried word line and the surface of the trench.

The disclosure also provides a method for manufacturing a memory device. The method includes performing a first etching process to form a trench in a semiconductor substrate. The trench has a first depth after the first etching process. The method also includes performing a first oxidation process to form a first oxide layer on a surface of the trench, performing a second etching process to deepen the trench from the first depth to a second depth, and performing a second oxidation process to form a second oxide layer on the surface of the deepened trench. After the second oxidation process, a gate dielectric layer is made of the first oxide layer and the second oxide layer. The gate dielectric layer includes a first portion extending downward from a top surface of the semiconductor substrate, a second portion extending upward from a bottom of the deepened trench, and a third portion formed between and adjoining the first portion and the second portion. The third portion tapers toward the second portion. The method also includes filling a conductive material into the deepened trench to form a gate electrode.

A detailed description is given in the following embodiments with reference to the accompanying drawings.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

Figure 1:
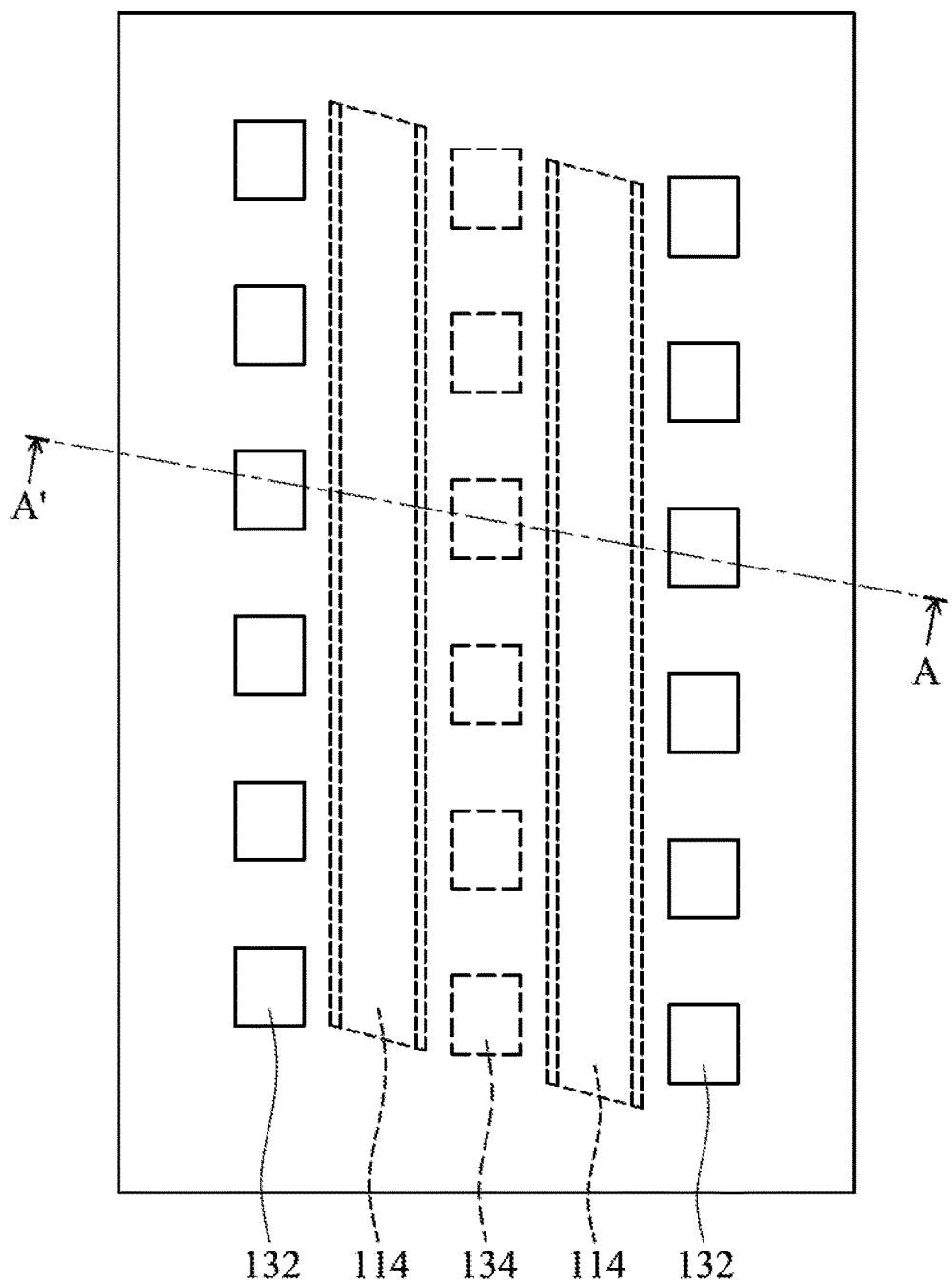
FIG. 1 shows a perspective top-view of a memory device in accordance with some embodiments.

The present disclosure is best understood from the following detailed description when read with the accompanying figures. It should be noted that, in accordance with the standard practice in the industry, various features are not drawn to scale. In fact, the relative dimensions of the various features may be arbitrarily increased or reduced for clarity of discussion. In addition, the present disclosure may repeat reference numerals and/or letters in the various examples. This repetition is for the purpose of simplicity and clarity and does not in itself dictate a relationship between the various embodiments and/or configurations discussed.

In the disclosure, the term "about" or "approximately" means in a range of 20% of a given value or range, preferably 10%, and more preferably 5%. In the disclosure, if there is no specific explanation, a given value or range means an approximate value which may imply the meaning of "about" or "approximately".

In some embodiments of the disclosure, a memory device and a method for fabricating the memory device are provided. FIG. 1 shows a perspective top-view of a memory device 100 in accordance with some embodiments.

Referring to FIG. 1, in the memory device 100 includes two parallel buried word lines 114, a plurality of contact structures 132, and a plurality of bit-line contact structures 134. Each buried word line 114 intersects a plurality of bit lines arranged in a column (not shown). Each bit line is connected to one of the bit-line contact structures 134. The contact structures 132 and the bit-line contact structures 134 are arranged in an array. A column of the contact structures 132 and a column of the bit-line contact structures 134 are respectively adjacent to two opposite sides of each buried word line 114, as shown in FIG. 1. Furthermore, to illustrate the top surfaces of the bit-line contact structures 134 and the buried word lines 114 are not coplanar with the top surface of the contact structures 132 (such as that illustrated in FIG. 2H), the bit-line contact structures 134 and the buried word lines 114 are depicted as dotted lines in FIG. 1. In addition, for the purpose of simplicity, only two buried word lines 114, two columns of contact structures 132, and one column of bit-line contact structures 134 are shown. It should be realized that changing the respective number of buried word lines 114, contact structures 132, and bit-line contact structures 134 is an option.

FIGS. 2A-2H show cross-sectional views of various stages of a memory device 100 in accordance with some embodiments. FIGS. 2A-2H are cross-sectional representations taken along line A-A' of FIG. 1.

Figure 2A:
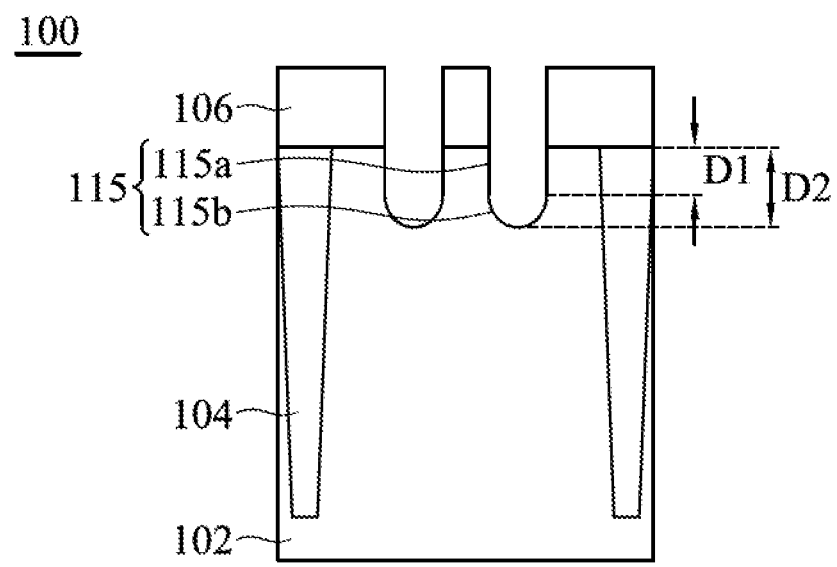
FIGS. 2A-2H show cross-sectional views of various stages of a memory device in accordance with some embodiments.

Referring to FIG. 2A, the memory device 100 includes two shallow trench isolation structures 104 formed in a semiconductor substrate 102, and an insulating layer 106 formed on the semiconductor substrate 102.

The material of the semiconductor substrate 102 may include silicon, gallium arsenide, gallium nitride, silicon germanium, silicon-on-insulator (SOI), another applicable material, or a combination thereof. In this embodiment, the material of the semiconductor substrate 102 is silicon. Examples of the material used to make the shallow trench isolation structure 104 may include an oxide, such as silicon oxide. Examples of the material used to make the insulating layer 106 include an oxide, a nitride, an oxynitride, and combinations thereof.

Still referring to FIG. 2A, a first etching process is performed remove a portion of the semiconductor substrate 102 and the insulating layer 106, and trenches 115 are formed. The trench 115 may include an upper portion 115a and a lower portion 115b. The upper portion 115a has a pair of parallel sidewalls, and the lower portion 115b has a convex cross-sectional profile (for example, semi-circular or any cross-sectional profiles curved outwards). Furthermore, the distance between the bottom of the upper portion 115a and the top surface of the semiconductor substrate 102 is the first depth D1, and the distance between the bottom of the lower portion 115b and the top surface of the semiconductor substrate 102 is the second depth D2.

The first etching process may include a dry etching process, a wet etching process, or a combination thereof. In some embodiments, the first etching process may be a two-step etching process. In the first step, an anisotropic dry etching step is performed to form the upper portion 115a which has parallel sidewalls. After the upper portion 115a reaches the predetermined depth, the second step is performed. In the second step, an isotropic dry etching step or an isotropic wet etching step is performed to form the lower portion 115b which has a convex cross-sectional profile. In this embodiment, the upper portion 115a of the trench 115 may have a pair of parallel sidewalls (i.e., uniform caliber) formed during the anisotropic etching step of the first step. This is advantageous for controlling the critical dimension of the memory device. Furthermore, the isotropic etching step of the second step may cause the lower portion 115b to have a convex cross-sectional profile. This is advantageous for improving the balance between the performance and the reliability of the memory device.

In some embodiments, the first step of the first etching process may be a dry etching step, and the second step of the first etching process may be a wet etching step. In other embodiments, the first step and the second step of the first etching process may be the same dry etching step, but different etching gases may be used during the first step and the second step.

In some embodiments, the same dry etching and the same etching gas may be used during the first step and the second step of the first etching process. Therefore, it is possible to control the degree of isotropy of the etching process just by adjusting the other parameters of the etching process without changing the process equipment and the etching gas. For example, the adjustable parameters may include, but are not limited to, the following examples: the flow rate of the etching gas, the pressure of the etching gas, the etching temperature, and/or the etching power. In some embodiments, the degree of isotropy of the etching process may be enhanced by reducing the flow rate of the etching gas.

In accordance with some embodiments of this disclosure, the first step and the second step of the first etching process is performed using the same dry etching step and the same etching gas. Accordingly, the process may be simplified, the yield may be increased, and the cost may be reduced. Furthermore, because the degree of isotropy of the etching process may be well controlled, the structure of the trench 115 may be precisely controlled as necessary. The structure of the trench 115 to be controlled may include the caliber and/or depth of the upper portion 115a and the shape of the cross-sectional profile of the lower portion 115b.

Figure 2B:
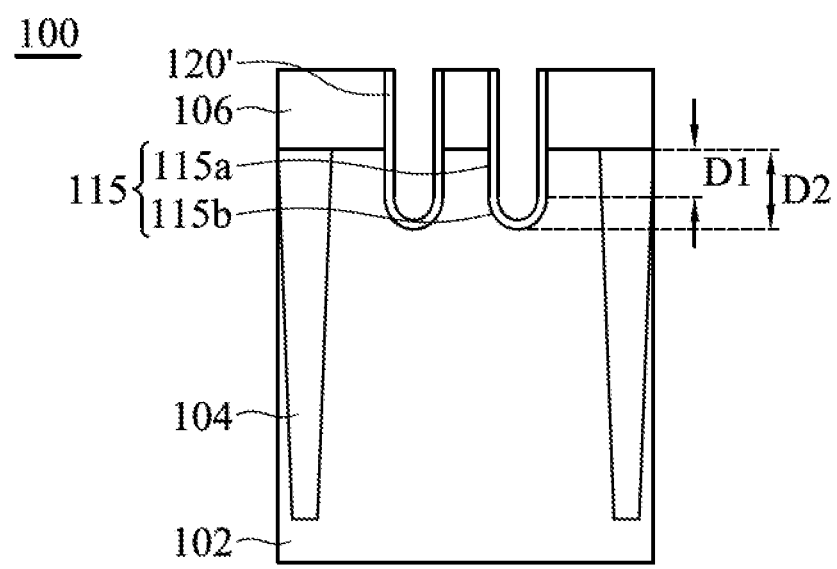

Referring to FIG. 2B, a first oxidation process is performed to form a first oxide layer 120' on the surfaces of the trenches 115. The first oxide layer 120' may be conformally formed on the sidewalls and the bottom of the trenches 115. Therefore, the cross-sectional profile of the first oxide layer 120' may correspond to and be the same as the cross-sectional profile of the trench 115.

In some embodiments, the first oxidation process may include a thermal oxidation process for oxidizing the semiconductor substrate 102. In some embodiments, the first oxidation process may be a dry thermal oxidation process. In other embodiments, the first oxidation process may be a wet thermal oxidation process, such as an in-situ steam generation (ISSG) process. In this embodiment, the material of the semiconductor substrate 102 is silicon, and the first oxide layer 120' is silicon oxide.

Figure 2C:
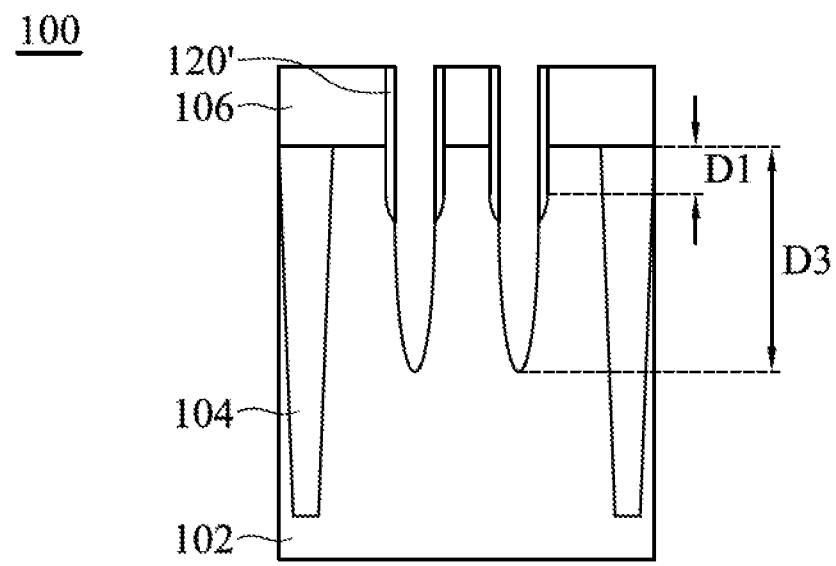

Referring to FIG. 2C, a second etching process is performed to deepen the trench 115. In other words, the depth of the trench 115 in the semiconductor substrate 102 is increased from the second depth D2 (as shown in FIG. 2A) to the third depth D3 (as shown in FIG. 2C).

The second etching process may include a dry etching process, a wet etching process, or a combination thereof. In some embodiments, the second etching process may be a single-step etching process. In some embodiments, the second etching process may be an anisotropic dry etching step. As a result, the depth of the trench 115 may be increased, and the first oxide layer 120' on the sidewalls of the trench 115 may not be removed. The first oxide layer 120' on the sidewalls of the trench 115 may be advantageous for improving the problem caused by the gate-induced drain leakage current (GIDL). The details will be discussed in the following paragraphs.

Figure 2D:
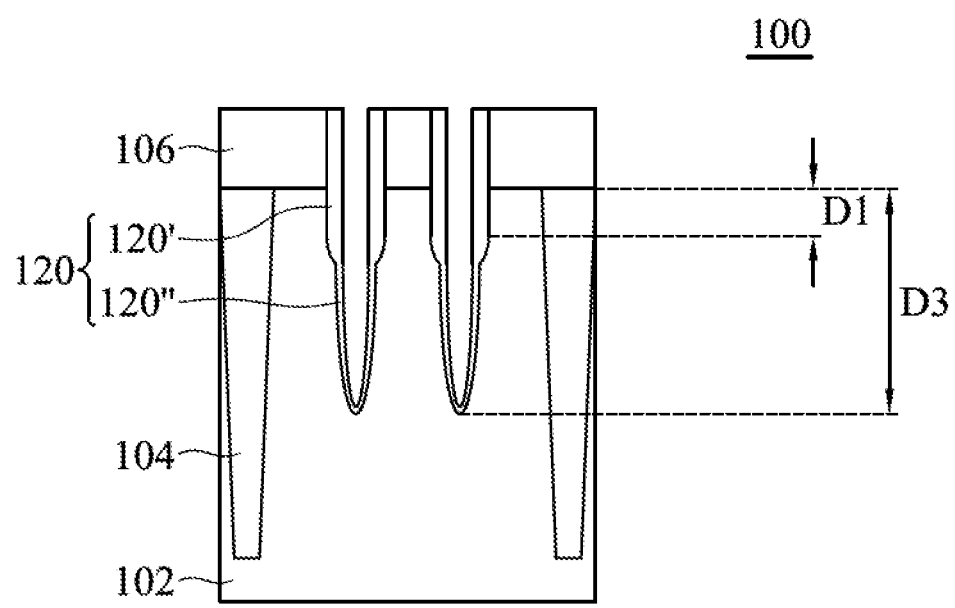

Referring to FIG. 2D, a second oxidation process is performed to form a second oxide layer 120" on the surface of the trench 115. The first oxide layer 120' and the second oxide layer 120" are made of the same material. Like the first oxide layer 120', the second oxide layer 120" may be conformally formed on the sidewalls and the bottom of the trench 115. Therefore, the cross-sectional profile of the first oxide layer 120' may correspond to and be the same as the cross-sectional profile of the sidewalls of the trench 115. The second oxidation process may be the same as or similar to the first oxidation process, and the details will not be repeated here.

In this embodiment, an oxide layer 120 which has different thicknesses is formed on the sidewalls of the trench 115, and the oxide layer 120 is used as the gate dielectric layer. The oxide layer 120 includes the first oxide layer 120' and the second oxide layer 120". The oxide layer with different thicknesses may be advantageous for improving the balance between the performance and the reliability of the memory device. The details will be discussed in the following paragraphs.

Figure 2E:
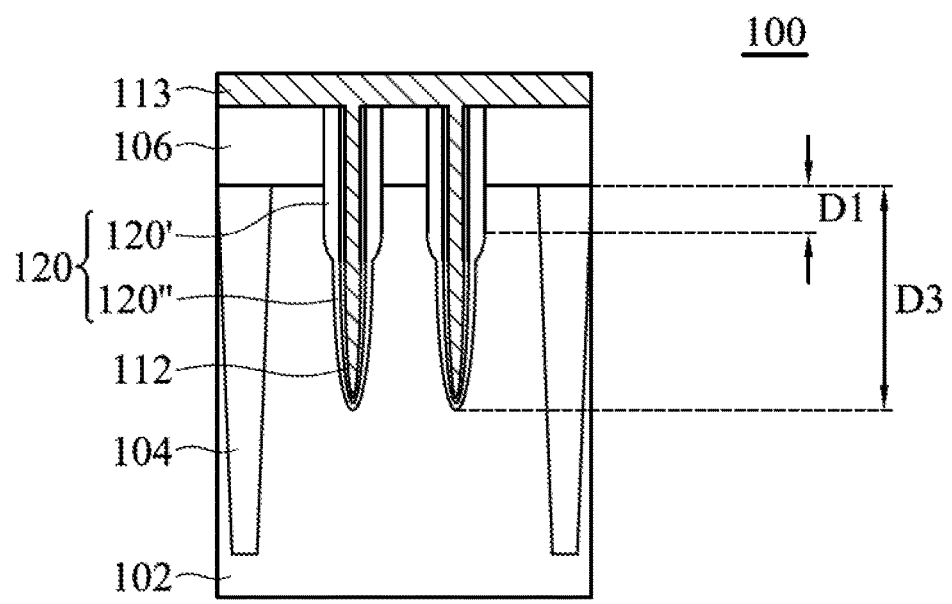
Figure 2F:
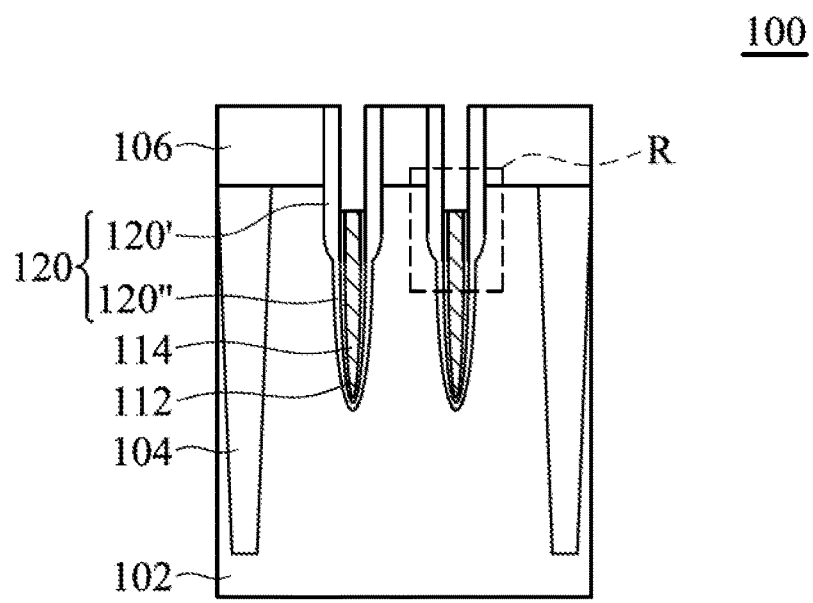

Referring to FIG. 2E, a buffer layer 112 may be optionally formed on the surface of the trench 115 which has the oxide layer 120 formed thereon. Then, a conductive material 113 may be filled into the trench 115 which has the oxide layer 120 and the buffer layer 112 sequentially formed thereon to form the buried word lines 114 (as shown in FIG. 2F). The buried word line 114 is used as the gate electrode. The buffer layer 112 is formed between the buried word line 114 and the oxide layer 120. The buried word line 114 may include any applicable conductive material, such as copper (Cu), tungsten (W), aluminum (Al), alloys thereof, and combinations thereof. Furthermore, the buried word line 114 may be formed by a suitable deposition process, such as a chemical vapor deposition (CVD) process, a physical vapor deposition (PVD) process, or another applicable deposition process.

In some embodiments, if the adhesion between the buried word line 114 (such as the one made of tungsten) and the oxide layer 120 is poor, the delamination may occur. As a result, an error during operation of the memory device may occur, and the reliability of the memory device may be reduced. In such embodiments, the buffer layer 112 may improve the adhesion between the buried word line 114 and the oxide layer 120, and therefore, the reliability of the memory device may be improved.

In other embodiments, the metal atoms or metal ions in the buried word line 114 (such as the one made of copper) may diffuse into the oxide layer 120. As a result, an error during operation of the memory device may occur. In such embodiments, the buffer layer 112 may reduce or prevent the diffusion of the metal atoms or metal ions in the buried word line 114, and therefore, the reliability of the memory device may be improved.

Depending on the material of the buried word line 114, a suitable material may be selected for the buffer layer 112. The buffer layer 112 may include titanium (Ti), titanium nitride (TiN), tantalum (Ta), tantalum nitride (TaN), or a combination thereof. Furthermore, the buffer layer 112 may be formed by a suitable deposition process, such as a chemical vapor deposition process, a physical vapor deposition process, or another applicable deposition process.

Referring to FIG. 2F, a portion of the conductive material 113 in the trench 115 is removed, and the top surface of the buried word line 114 is lower than the top surface of the semiconductor substrate 102. The process for removing the conductive material 113 may include a dry etching process, a wet etching process, or a combination thereof. Controlling the position of the top surface of the buried word line 114 may be advantageous for improving the balance between the performance and the reliability of the memory device. The details will be discussed in the following paragraphs.

Figure 2G:
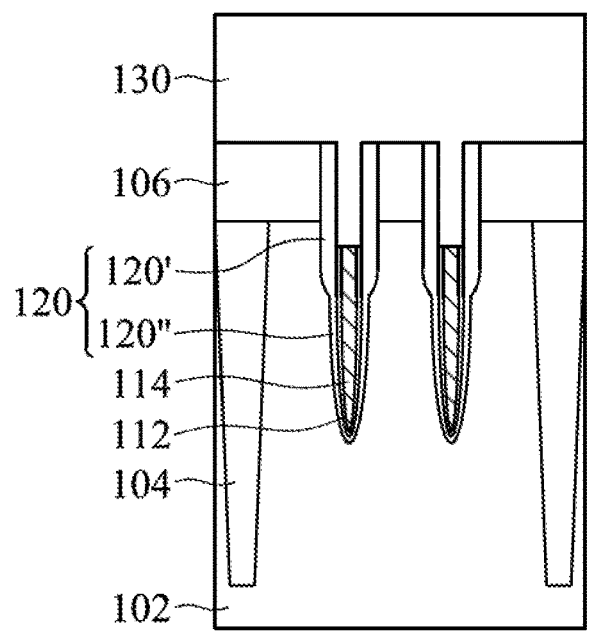

Referring to FIG. 2G, a dielectric material is formed on the insulating layer 106 and filled into the trench 115 which has the oxide layer 120 and the buffer layer 112 sequentially formed thereon and is then partially filled with the buried word line 114 to form a dielectric material layer 130. The dielectric material layer 130 may include a nitride, an oxide, a high-k dielectric material, or other applicable dielectric material.

Figure 2H:
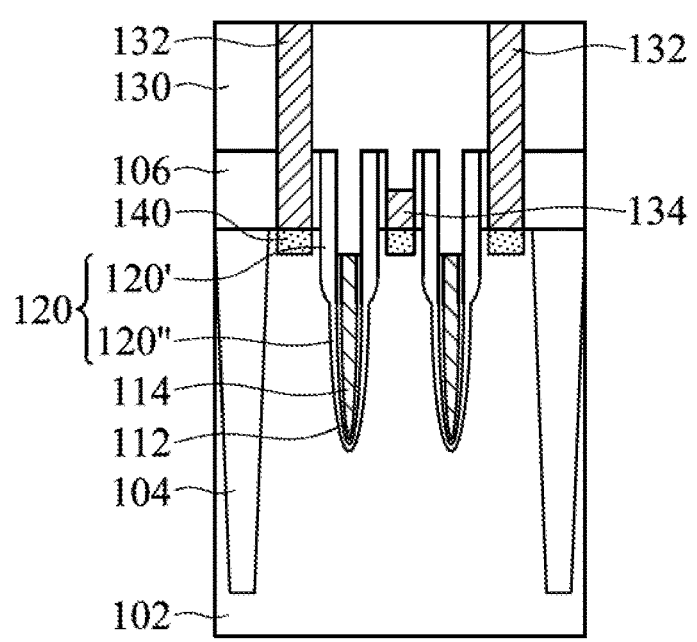

Referring to FIG. 2H, the dielectric material layer 130 and the insulating layer 106 are patterned to form an opening which exposes the top surface of the semiconductor substrate 102. After exposing the semiconductor substrate 102, an implantation process is performed to form the source/drain 140. After forming the source/drain 140, source/drain contact structures 132 and bit-line contact structures 134 may be formed on the source/drain 140.

A source may be formed on one side of the buried word line 114, and a drain may be formed on the other side. For example, in the FIG. 2H, if the implanted region on the left side of the left buried word line 114 is the source, the implanted region between the two adjacent buried word lines 114 is the drain, and the implanted region on the right side of the right buried word line 114 is also the source. In other embodiments, the relative positions of the source/drain 140 may be reversed. Therefore, in this disclosure, the implanted regions located on both sides of the buried word line 114 are collectively referred to the source/drain 140.

More specifically, the steps for forming the source/drain 140 may be as follows. Referring to FIG. 2H, the dielectric material layer 130 and the insulating layer 106 are patterned to form a first opening between the two adjacent buried word lines 114 to expose the semiconductor substrate 102. Next, the first implantation process is performed to form the source/drain 140 in the semiconductor substrate 102 below the first opening. A conductive material is then filled into the first opening to form the bit-line contact structure 134. The top surface of the bit-line contact structure 134 may be not higher than the top surface of the insulating layer 106, as shown in FIG. 2H. Then, a dielectric material (such as nitride), which is the same as the dielectric material layer 130, is formed on the bit-line contact structure 134 and filled into the first opening.

Still referring to FIG. 2H, after forming the bit-line contact structure 134, the dielectric material layer 130 and the insulating layer 106 are patterned again to form two second openings outside the two adjacent buried word lines 114 (i.e., on the left side of the left buried word line 114 and on the right side of the right buried word line 114), respectively. Next, the second implantation process is performed to form the source/drain 140 in the semiconductor substrate 102 below the second openings. A conductive material is then filled into the second openings to form the source/drain contact structures 132 which correspond to the source/drain 140. The top surface of the source/drain contact structures 132 may be level with the top surface of the dielectric material layer 130, as shown in FIG. 2H.

In some embodiments, the memory device 100 may be a dynamic random access memory. In such embodiments, when the memory device 100 saves the data (i.e., it is in the "ON" state), the operating voltage may be applied to separate the electrons and holes, and the separated holes may be concentrated in the gate electrode (i.e., the buried word line 114). After the save is completed, in order to prevent the holes from returning to their original position and recombining with the electrons (i.e., it is in the "OFF" state), a small negative bias may be applied to the gate electrode. As a result, because the holes are attracted and held around the gate electrode, the memory device 100 may maintain the "ON" state. However, this small negative bias and the accumulated holes may form an electric field. The resulting electric field may cause the electrons and holes of the semiconductor substrate 102 located between the gate electrode and the drain to be separated, and may drive the separated electrons to move to the drain. The current generated by the movement of these electrons is called "gate-induced drain leakage current". The gate-induced drain leakage current may cause an error during operation of the memory device 100, and therefore, the reliability of the memory device 100 may be reduced.

In order to reduce the gate-induced drain leakage current, the thickness of the gate dielectric layer between the gate electrode and the drain may be increased. However, if the thickness of the gate dielectric layer is too thick, the operating current may be too small. As a result, a higher voltage may be necessary to turn on the memory device 100. Therefore, the power consumption of the memory device 100 is increased, and the performance of the memory device 100 is degraded. It is even possible that the memory device 100 cannot be turned on, and therefore, the reliability or yield of the memory device 100 may be reduced.

Furthermore, in the memory device 100 shown in FIG. 2H, if the depth of the top surface of the buried word line 114 is increased, the distance between the buried word line 114 and the drain 140 is increased. Therefore, the gate-induced drain leakage current may be reduced. However, if the depth of the top surface of the buried word line 114 is too large, the volume of the gate electrode is significantly reduced. Therefore, the electrical resistance of the gate electrode is significantly increased. As a result, the power consumption of the memory device 100 is increased, and the performance of the memory device 100 is degraded.

The memory device 100 and its manufacturing method provide in this disclosure may significantly improve the balance between the performance and the reliability of the memory device.

Figure 3:
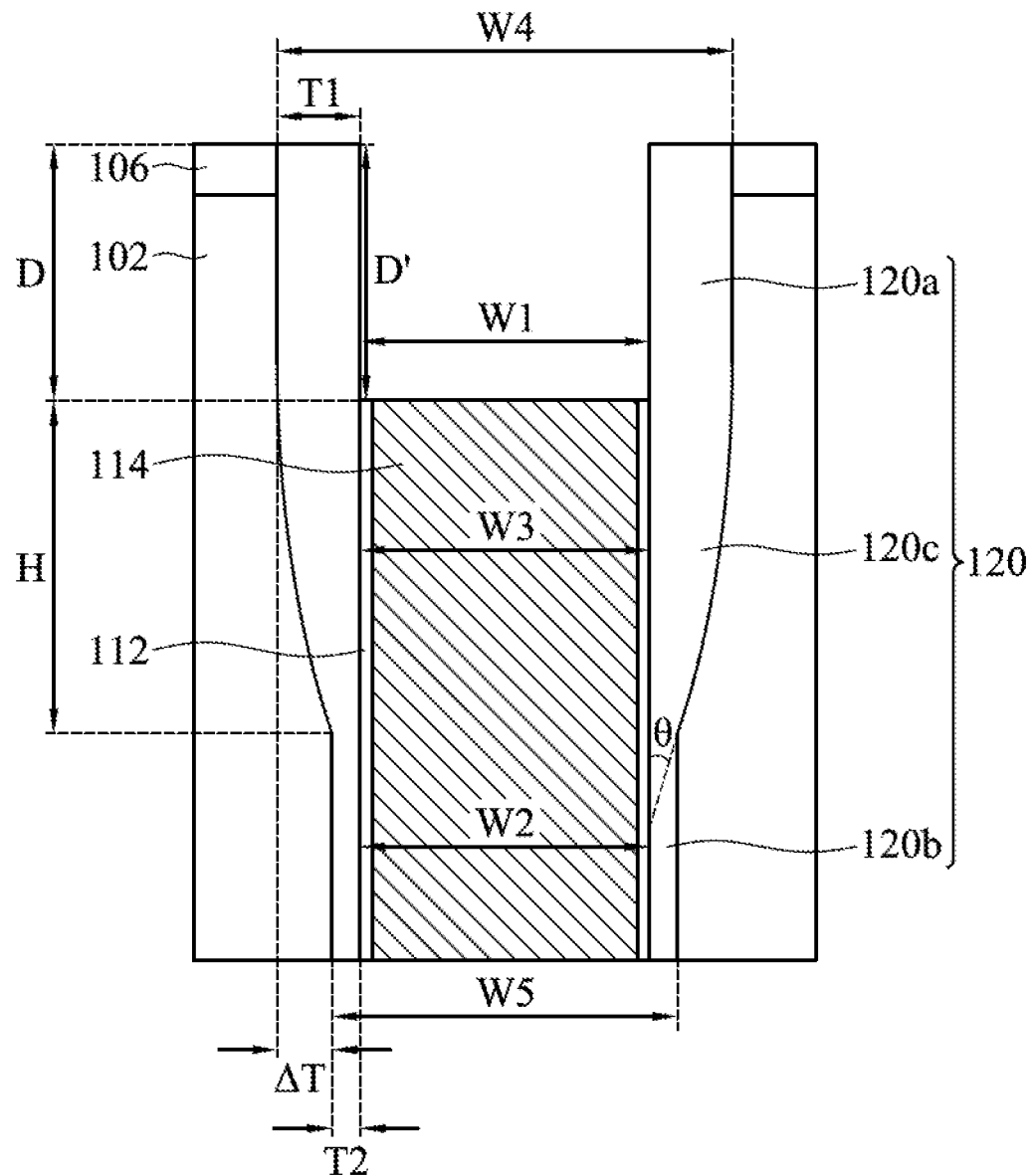
FIG. 3 shows an enlarged cross-sectional view of the region R of FIG. 2F.

FIG. 3 shows an enlarged cross-sectional view of the region R of FIG. 2F. Referring to FIG. 3, the oxide layer 120 (i.e., the gate dielectric layer) includes the first portion 120a, the second portion 120b, and the third portion 120c. The first portion 120a extends downward from the top surface of the semiconductor substrate 102 along the sidewalls of the trench 115. The second portion 120b extends upward from the bottom of the trench 115 along the sidewalls of the trench 115. The third portion 120c extends between the first portion 120a and the second portion 120b along the sidewalls of the trench 115. The third portion 120c has a thickness which tapers from the first portion 120a toward the second portion 120b. The first portion 120a, the second portion 120b, and the third portion 120c are located between the buried word line 114 and the surface of the trench 115. In other words, the sidewall of the buried word line 114 is surrounded by each of the first portion 120a, the second portion 120b, and the third portion 120c. The first portion 120a, the second portion 120b, and the third portion 120c of the oxide layer 120 has different thickness, respectively. The first portion 120a is the combination of the first oxide layer 120' and the second oxide layer 120". Therefore, the first portion 120a may have a uniform first thickness T1. The second portion 120b only includes the second oxide layer 120". Therefore, the second portion 120b may have a uniform second thickness T2.

As shown in FIG. 3, the third portion 120c is formed between the first portion 120a and the second portion 120b, and it adjoins the first portion 120a and the second portion 120b. The third portion 120c is the combination of the lower portion of the first oxide layer 120' and the second oxide layer 120". Therefore, the thickness of the third portion 120c is gradually decreased from the first thickness T1 at the top portion to the second thickness T2 at the bottom portion. In other words, because the lower portion 115b of the trench 115 has a convex cross-sectional profile (for example, semi-circular or any cross-sectional profiles curved outward), the third portion 120c has the thickness which tapers downward.

Referring to FIG. 2H and FIG. 3, the first portion 120a of the oxide layer 120 is located between the gate electrode 114 and the drain 140. Therefore, when the first thickness T1 of the first portion 120a is increased, the gate-induced drain leakage current may be significantly reduced. If the first thickness T1 is too small, it is disadvantageous for reducing the gate-induced drain leakage current. On the other hand, if the first thickness T1 is too large, too much available area for the contact structures is occupied by the oxide layer 120. Therefore, it is disadvantageous in the miniaturization of the memory device. In some embodiments, the first thickness T1 is 0.5-10 nm.

Furthermore, when the second thickness T2 of the second portion 120b is smaller than the first thickness T1 of the first portion 120a, the operating current of the memory device 100 may be increased. Therefore, the operating voltage of the memory device 100 may be reduced, and the reliability of the memory device 100 may be increased. If the second thickness T2 is too small, the oxide layer 120 cannot be used as the gate dielectric layer. On the other hand, if the second thickness T2 is too large, the operating voltage of the memory device 100 cannot be reduced. In some embodiments, the second thickness T2 is 0.2-6 nm.

For the purpose of reducing the gate-induced drain leakage current and increasing the reliability of the memory device, the ratio T1/T2 of the first thickness T1 to the second thickness T2 may be controlled within a specific range. If the ratio T1/T2 is too small, it is disadvantageous for reducing the gate-induced drain leakage current. On the other hand, if the T1/T2 is too large, the available area for the contact structures may be reduced. Therefore, the electrical resistance may be increased, and it is disadvantageous for operating the memory device. In some embodiments, the ratio T1/T2 is 1.5-15.

Still referring to FIG. 3, the first distance W1 between the inner sidewalls of the first portion 120a of the oxide layer 120, the second distance W2 between the inner sidewalls of the second portion 120b, and the third distance W3 between the inner sidewalls of the third portion 120c are equal to one another. Furthermore, the fourth distance W4 between the outer sidewalls of the first portion 120a is greater than the fifth distance W5 between the outer sidewalls of the second portion 120b. In an alternative embodiment, the first distance W1 is not less than the third distance W3.

In such embodiments, even if the first thickness T1 of the first portion 120a is increased for the purpose of reducing the gate-induced drain leakage current, the cross-sectional profile of the gate electrode (or buried word line) 114 has a uniform width from the top to the bottom. Because the width of the buried word line 114 is not reduced, particularly from the upper portion of the buried word line 114 surrounded by the first portion 120a to the middle portion of the buried word line 114 surrounded by the third portion 120c, the electrical resistance of the gate electrode will not be significantly increased. In other words, in this embodiment, the gate-induced drain leakage current may be significantly reduced without increasing the electrical resistance of the gate electrode.

In the structure shown in FIG. 3, the relative position of the third portion 120c of the oxide layer 120 and the buried word line 114 is also an important parameter that affects the performance and the reliability of the memory device 100.

Referring to FIG. 2C and FIG. 3, the distance between the top of the third portion 120c and the top surface of the semiconductor substrate 102 is the depth D. The depth D is substantially equal to the first depth D1 of the upper portion 115a of the trench 115. Furthermore, referring to FIG. 3, the height of the third portion 120c is the height H. In other words, the distance between the bottom of the third portion 120c and the top surface of the semiconductor substrate 102 (or the depth of the bottom of the third portion 120c) is (D+H). Referring to FIG. 3, FIG. 2B and FIG. 2C, the depth (D+H) is not greater than the second depth D2 of the trench 115. Therefore, the depth of the top and the bottom of the third portion 120c may be respectively controlled by adjusting the first depth D1 and the second depth D2 of the trench 115.

In this embodiment, the distance between the top surface of the buried word line 114 and the top surface of the semiconductor substrate 102 (or the depth of the top surface of the buried word line 114) is D', as shown in FIG. 3. If the depth D' of the top surface of the buried word line 114 is increased, the gate-induced drain leakage current is reduced. However, if the depth D' is increased, the electrical resistance of the gate electrode is also increased. As a result, the power consumption of the memory device 100 is increased, and the performance of the memory device 100 is degraded.

In some embodiments, the distance (or the depth) D' between the top surface of the buried word line 114 and the top surface of the semiconductor substrate 102 is in a range between the depth D and the depth (D+H). In other words, the top surface of the buried word line 114 is not higher than the interface between the third portion 120c and the first portion 120a, and the top surface of the buried word line 114 is not lower than the interface between the third portion 120c and the second portion 120b.

If the depth D' of the top surface of the buried word line 114 is smaller than the depth D of the top portion of the third portion 120c, the distance between the gate electrode and the drain is too short. Therefore, the gate-induced drain leakage current cannot be significantly reduced. On the other hand, if the depth D' of the top surface of the buried word line 114 is greater than the depth (D+H) of the bottom portion of the third portion 120c, the area of the cross-sectional profile of the gate electrode is significantly reduced. Therefore, the electrical resistance of the gate electrode is significantly increased.

Referring to FIG. 3, the third portion 120c has a thickness which tapers from the first portion 120a toward the second portion 120b. When the depth D' of the top surface of the buried word line 114 is between the depth D and the depth (D+H), the gate-induced drain leakage current is reduced as the depth D' is increased, and the electrical resistance of the gate electrode is increased as the depth D' is increased. Therefore, the gate-induced drain leakage current and the electrical resistance of the gate electrode may respectively be controlled within specific desirable ranges by controlling the depth D' of the top surface of the buried word line 114. As a result, the balance between the performance and the reliability of the memory device is improved.

In this embodiment, the distance (or the depth) D' between the top surface of the buried word line 114 and the top surface of the semiconductor substrate 102 is equal to the depth D of the top of the third portion 120c. Therefore, in this embodiment, the performance and the reliability of the memory device is well balanced.

In addition, in the structure shown in FIG. 3, the cross-sectional profile of the third portion 120c of the oxide layer 120 is also an important parameter that affects the performance and the reliability of the memory device 100.

Referring to FIG. 3, the top of the third portion 120c has the first thickness T1, the bottom of the third portion 120c has the second thickness T2, and the difference between the first thickness T1 and the second thickness T2 is ΔT (i.e., T1-T2). Furthermore, the height of the third portion 120c is the height H. Therefore, in the third portion 120c, there is a ratio H/ΔT of the height H to the difference ΔT.

The value of the ratio H/ΔT may be used to describe the cross-sectional profile of the third portion 120c. If the value of the ratio H/ΔT is too small, this indicates that the third portion 120c is narrowed down sharply. Therefore, even if the depth D' of the top surface of the buried word line 114 is increased, the gate-induced drain leakage current cannot be effectively reduced. Furthermore, if the value of the ratio H/ΔT is too small, it indicates that the adjustable range of the depth D' of the top surface of the gate electrode 114 is smaller. That is, the process window is smaller. As a result, it is difficult to control the gate-induced drain leakage current and the electrical resistance of the gate electrode respectively within desirable specific ranges.

On the other hand, if the value of the ratio H/ΔT is too large, this indicates that the third portion 120c is narrowed down smoothly or the thickness of the third portion 120c is nearly equal to the thickness T2 of the second portion 120b. As a result, a higher voltage is necessary to turn on the memory device 100, and it is probable that the gate-induced drain leakage current cannot be effectively reduced.

In some embodiments, the difference ΔT between the first thickness T1 and the second thickness T2 is 0.5-10 nm. In some embodiments, the ratio H/ΔT of the height H to the difference ΔT is 0.5-50.

Still referring to FIG. 3, an angle θ is included between the extension line of the inner sidewall and the extension line of the outer sidewall of the third portion 120c, and the extension line of the inner sidewall and the extension line of the outer sidewall of the third portion 120c intersect on the inner sidewall of the second portion 120b. The included angle θ may be also used to describe the cross-sectional profile of the third portion 120c. If the included angle θ is too small, it indicates that the third portion 120c is narrowed down smoothly. On the other hand, if the included angle θ is too large, it indicates that the third portion 120c is narrowed down sharply. Therefore, in order to achieve the balance between the performance and the reliability of the memory device, the included angle θ may be controlled within a specific range. In some embodiments, the included angle θ is 30-85 degrees. In other embodiments, the included angle θ is 45-85 degrees.

Referring to FIG. 1, FIG. 2H and FIG. 3, a memory device 100 is provided in accordance with some embodiments of this disclosure. The memory device 100 includes the semiconductor substrate 102, the shallow trench isolation structures 104 (not shown in FIG. 1), the buried word lines 114 filled in the trenches 115 which have the oxide layers 120 and the buffer layers sequentially formed thereon, the sources/drains 140 (not shown in FIG. 1), the source/drain contact structures 132, and the bit-line contact structures 134.

The oxide layer 120 is formed on the surface of the trench 115, and it includes the first portion 120a, the second portion 120b, and the third portion 120c. The first portion 120a extends downward from the top surface of the semiconductor substrate 102. The second portion 120b extends upward from the bottom portion of the trench 115. The third portion 120c is formed between the first portion 120a and the second portion 120b, and it adjoins the first portion 120a and the second portion 120b. The third portion 120c has a thickness which tapers toward the second portion 120b.

The top surface of the buried word line 114 is not higher than the interface between the third portion 120c and the first portion 120a, and the top surface of the buried word line 114 is not lower than the interface between the third portion 120c and the second portion 120b. The buffer layer 112 is formed to be sandwiched between the buried word line 114 and the oxide layer 120.

The sources/drains 140 are formed on the two opposite sides of the trench 115. The source/drain contact structures 132 are formed on the sources/drains 140, and they are electrically connected to the sources/drains 140.

As described above, in some embodiments, the third portion 120c which tapers downward is formed on the sidewalls of the trench 115, and the depth of the top surface of the buried word line 114 is controlled between the top and the bottom of the third portion 120c. As a result, a balance between the performance and the reliability of the resulting memory device 100 may be achieved.

Figure 4A:
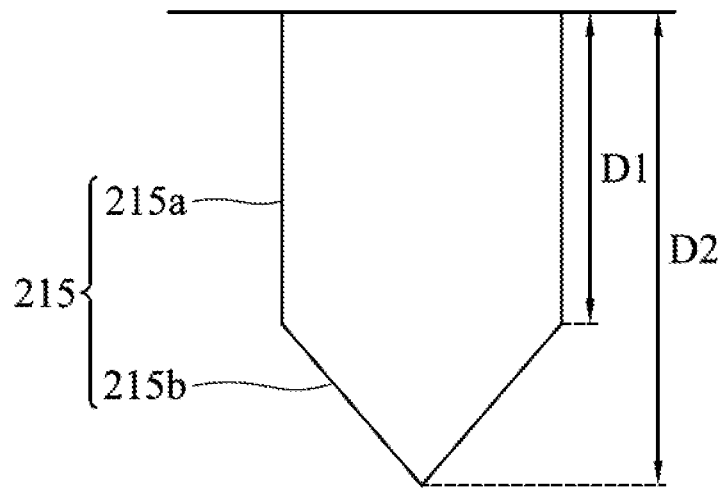
FIGS. 4A-4C show cross-sectional views of trenches in accordance with other embodiments.
Figure 4B:
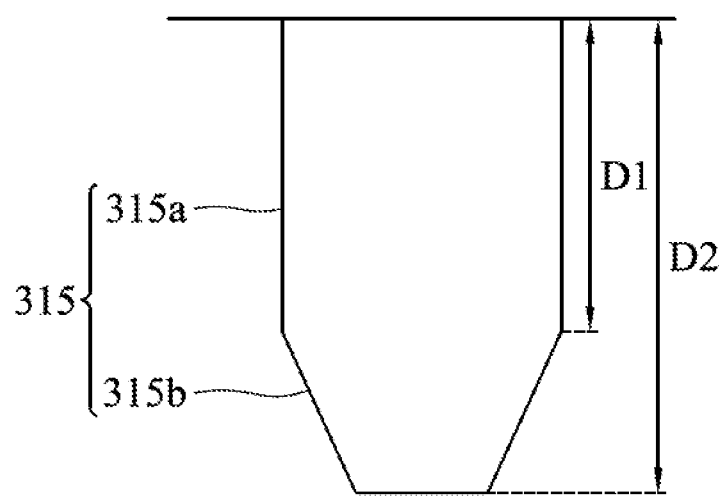
Figure 4C:
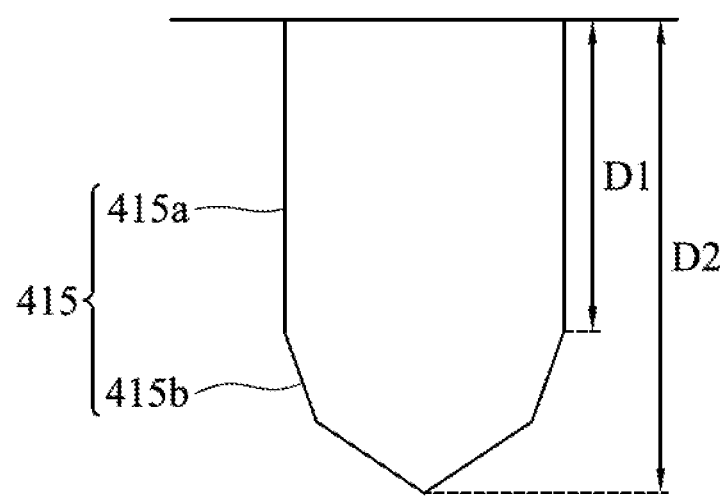

FIGS. 4A-4C show cross-sectional views of trenches in accordance with other embodiments.

Referring to FIG. 4A, in some embodiments, the first etching process is performed to form a trench 215. The trench 215 may include an upper portion 215a and a lower portion 215b. The upper portion 215a has a pair of parallel sidewalls, and the lower portion 215b has an inverted triangle cross-sectional profile, as shown in FIG. 4A. Furthermore, the distance between the bottom of the upper portion 215a and the top surface of the semiconductor substrate 102 is the first depth D1, and the distance between the bottom of the lower portion 215b and the top surface of the semiconductor substrate 102 is the second depth D2, as shown in FIG. 4A.

Referring to FIG. 4B, in other embodiments, the first etching process is performed to form a trench 315. The trench 315 may include an upper portion 315a and a lower portion 315b. FIG. 4B is similar to FIG. 4A, except that the lower portion 315b of the trench 315 has an inverted trapezoid cross-sectional profile.

Referring to FIG. 4C, in other embodiments, the first etching process is performed to form a trench 415. The trench 415 may include an upper portion 415a and a lower portion 415b. FIG. 4C is similar to FIG. 4A, except that the lower portion 415b of the trench 415 has a pentagon cross-sectional profile.

As described above, the lower portion 115b of the trench 115 has a convex cross-sectional profile, as shown in FIG. 2A. Therefore, the third portion 120c of the oxide layer 120 has a thickness which tapers downward, s shown in FIG. 3. Similar to the trench 115 shown in FIG. 2A, because the trenches 215, 315, and 415 respectively shown in FIG. 4A, FIG. 4B, and FIG. 4C have the cross-sectional profiles which tapers downward, each of the third portions of the oxide layers formed on the trenches 215, 315, and 415 may have the thickness which tapers downward.

In addition, the first depth D1 and the second depth D2 of the trenches shown in FIGS. 4A-4C may be the same as or similar to the first depth D1 and the second depth D2 of the trench 115 shown in FIG. 2A. As described above, the depths of the top and the bottom of the third portion of the oxide layer may be controlled by adjusting the first depth D1 and the second depth D2 of the trench.

It should be realized that the cross-sectional profiles of the trenches shown in FIG. 2A and FIGS. 4A-4C are merely examples and are not intended to be limiting. For example, the cross-sectional profile of the lower portion of the trench may be a semi-circle, an inverted triangle, an inverted trapezoid, an irregular polygon, or a combination thereof. Furthermore, in other embodiments, the cross-sectional profile of the lower portion of the trench may be linear (As shown in FIGS. 4A-4C), curved (As shown in FIG. 2A), zigzag, or a combination thereof. In such embodiments, the cross-sectional profile of the subsequently formed oxide layer may correspond to the cross-sectional profile of the trench. Therefore, the cross-sectional profile of the outer sidewalls of the oxide layer may be linear, curved, zigzag, or a combination thereof.

In addition, by adjusting the parameters of the first etching process, the degree of isotropy of the etching process may be controlled, and a desirable cross-sectional profile of the trench may be obtained.

As described above, in accordance with some embodiments of this disclosure, a memory device which has good performance and good reliability is provided. Furthermore, in accordance with some embodiments of this disclosure, a low-cost and efficient manufacturing method for manufacturing the memory device which has good performance and good reliability is provided.

More specifically, the advantages of the memory device and its manufacturing method at least include:

(1) The oxide layer includes the first portion with a thicker thickness. Therefore, the gate-induced drain leakage current may be reduced, and the reliability of the memory device may be improved.

(2) The oxide layer includes the second portion with a thinner thickness. Therefore, the power consumption and the turn-on voltage of the memory device may be reduced, and the reliability or yield of the memory device may be improved.

(3) The oxide layer includes the third portion which tapers downward, and the depth of the top surface of the gate electrode is between the top and the bottom of the third portion. As a result, the gate-induced drain leakage current and the electrical resistance of the gate electrode may be respectively controlled within desirable specific ranges.

(4) The oxide layer is formed by performing the first etching process, the first oxidation process, the second etching process, and the second oxidation process sequentially. Therefore, a complex manufacturing process is not essential for forming the oxide layer. As a result, the time and cost of production may be reduced.

(5) The degree of isotropy of the etching process may be controlled by adjusting the parameters of the etching process. Therefore, the caliber, the depth, and the cross-sectional profile of the trench may be precisely controlled to meet requirements.

(6) The manufacturing method shown in the embodiments of this disclosure may be integrated into the existing manufacturing process of the memory device additionally replacing or modifying the production equipment. As a result, the reliability and yield of the memory device may be significantly improved without increasing the process complexity and manufacturing cost.

Although the disclosure has been described by way of example and in terms of the preferred embodiments, it should be understood that various modifications and similar arrangements (as would be apparent to those skilled in the art) can be made herein without departing from the spirit and scope of the disclosure as defined by the appended claims.

What is claimed is:

1. A memory device, comprising:
a semiconductor substrate having a trench;
an oxide layer formed on a surface of the trench, wherein the oxide layer comprises:
a first portion extending downward from a top surface of the semiconductor substrate;
a second portion extending upward from a bottom of the trench; and
a third portion formed between and adjoining the first portion and the second portion, wherein the third portion tapers toward the second portion; and
a buried word line formed in the trench having the oxide layer formed thereon, such that the first portion of the oxide layer is located between the buried word line and the surface of the trench.

2. The memory device as claimed in claim 1, wherein the first portion has a first thickness T1, the second portion has a second thickness T2, and the first thickness T1 is greater than the second thickness T2.

3. The memory device as claimed in claim 2, wherein a ratio T1/T2 of the first thickness T1 to the second thickness T2 is 1.5-15.

4. The memory device as claimed in claim 2, wherein the first thickness T1 is 0.5-10 nm.

5. The memory device as claimed in claim 1, wherein a distance between a top of the third portion and the top surface of the semiconductor substrate is a first depth, and a distance between a bottom of the third portion and the top surface of the semiconductor substrate is a second depth, wherein the second depth is greater than the first depth, wherein the buried word line has a top surface, and a distance between the top surface of the buried word line and the top surface of the semiconductor substrate is a third depth, and wherein the third depth is between the first depth and the second depth.

6. The memory device as claimed in claim 1, wherein a top portion of the third portion has a first thickness T1, a bottom portion of the third portion has a second thickness T2, and a difference ΔT between the first thickness T1 and the second thickness T2 is 0.5-10 nm.

7. The memory device as claimed in claim 6, wherein the third portion has a height H, and a ratio H/ΔT of the height H to the difference ΔT is 0.5-50.

8. The memory device as claimed in claim 1, wherein the first portion comprises a pair of first inner sidewalls, the second portion comprises a pair of second inner sidewalls, and a first distance W1 between the pair of first inner sidewalls is equal to a second distance W2 between the pair of second inner sidewalls.

9. The memory device as claimed in claim 8, wherein the third portion comprises a pair of third inner sidewalls, and a third distance W3 between the pair of third inner sidewalls is equal to the first distance W1.

10. The memory device as claimed in claim 8, wherein the third portion comprises an inner sidewall and an outer sidewall, and an included angle between the inner sidewall and the outer sidewall is 45-85 degrees.

11. The memory device as claimed in claim 1, wherein the first portion comprises a pair of first outer sidewalls, the second portion comprises a pair of second outer sidewalls, and a fourth distance W4 between the pair of first outer sidewalls is greater than a fifth distance W5 between the pair of second outer sidewalls.

12. The memory device as claimed in claim 1, wherein the first portion comprises a pair of first inner sidewalls, the third portion comprises a pair of third inner sidewalls, and a first distance W1 between the pair of first inner sidewalls is not less than a third distance W3 between the pair of third inner sidewalls.

13. A method for manufacturing a memory device, comprising:
performing a first etching process to form a trench in a semiconductor substrate, wherein the trench has a first depth;
performing a first oxidation process to form a first oxide layer on a surface of the trench;
performing a second etching process to deepen the trench from the first depth to a second depth;
performing a second oxidation process to form a second oxide layer on the surface of the deepened trench, wherein a gate dielectric layer is made of the first oxide layer and the second oxide layer, and wherein the gate dielectric layer comprises:
a first portion extending downward from a top surface of the semiconductor substrate;
a second portion extending upward from a bottom portion of the deepened trench; and
a third portion formed between and adjoining the first portion and the second portion, wherein the third portion tapers toward the second portion; and
filling a conductive material into the deepened trench to form a gate electrode.

14. The method for manufacturing a memory device as claimed in claim 13, wherein the trench has an upper portion and a lower portion before the first oxidation process, and the lower portion has a cross-sectional profile of a semi-circle, an inverted triangle, an inverted trapezoid, an irregular polygon, or a combination thereof.

15. The method for manufacturing a memory device as claimed in claim 13, wherein the first etching process comprises a dry etching process, a wet etching process, or a combination thereof.

16. The method for manufacturing a memory device as claimed in claim 13, wherein the first oxidation process comprises a thermal oxidation process.

17. The method for manufacturing a memory device as claimed in claim 13, wherein a top surface of the gate electrode is not higher than an interface between the third portion and the first portion, and the top surface of the gate electrode is not lower than an interface between the third portion and the second portion.

18. The method for manufacturing a memory device as claimed in claim 13, wherein the first portion of the oxide layer is located between the gate electrode and the surface of the deepened trench.

19. The method for manufacturing a memory device as claimed in claim 18, wherein the first portion has a first thickness T1, the second portion has a second thickness T2, and the first thickness T1 is greater than the second thickness T2.

20. The method for manufacturing a memory device as claimed in claim 18, wherein the first portion comprises a pair of first inner sidewalls, the third portion comprises a pair of third inner sidewalls, and a first distance W1 between the pair of first inner sidewalls is not less than a third distance W3 between the pair of third inner sidewalls.

\* \* \* \* \*